United States Patent [19]

Sieborger et al.

[11] 4,037,118
[45] July 19, 1977

[54] CIRCUIT ARRANGEMENT FOR ELECTRONICALLY APPLYING AN ALTERNATING VOLTAGE

[75] Inventors: Gunter Sieborger; Ernst August Kilian; Gerhard Jonkuhn, all of Hamburg, Germany

[73] Assignee: U.S. Philips Corporation, New York, N.Y.

[21] Appl. No.: 655,513

[22] Filed: Feb. 5, 1976

[30] Foreign Application Priority Data

Feb. 13, 1975 Germany .............................. 2506034

[51] Int. Cl.² ...................... H03K 17/16; H03K 17/60
[52] U.S. Cl. .................................... 307/255; 307/237; 307/243; 307/296 R; 328/104
[58] Field of Search ............... 307/237, 241, 242, 243, 307/254, 255, 296; 328/104, 154; 179/15 AN

[56] References Cited

U.S. PATENT DOCUMENTS

| | | | |
|---|---|---|---|
| 3,213,290 | 10/1965 | Klein et al. | 307/243 X |
| 3,320,590 | 5/1967 | Rovell | 307/243 X |
| 3,594,590 | 7/1971 | Smith | 307/243 |
| 3,657,562 | 4/1972 | Cottatellucci | 307/243 |
| 3,681,699 | 8/1972 | Kelly et al. | 307/243 |

*Primary Examiner*—John Zazworsky
*Attorney, Agent, or Firm*—Frank R. Trifari; Steven R. Biren

[57] ABSTRACT

The disclosure relates to an integrated circuit which is suitable as an LF switch, which enables switching without the switching clicks normally produced by semiconductor circuits. For this purpose the circuit arrangement is designed so that during switching the input direct voltage of the switch remains substantially unchanged.

6 Claims, 2 Drawing Figures

CIRCUIT ARRANGEMENT FOR ELECTRONICALLY APPLYING AN ALTERNATING VOLTAGE

The invention relates to a circuit arrangement which enables switching without the switching clicks normally produced by such circuits. Such circuit arrangements may for example be used for connecting one of a multiplicty of alternating voltage sources (for example a tape recorder or record player) to an output amplifier which drives a loudspeaker.

Such a circuit arrangement has several advantages compared with an alternating voltage switch with mechanical contacts. The circuit arrangement (generally an integrated circuit) may for example be arranged at a location of a transmission apparatus which is optimum with respect to the wiring. In the case of an alternating voltage switch with mechanical contacts, which are for example actuated by a push-button switch, this is not possible because the signal leads must then be led to the control panel at the front on which the push-button switch is disposed. As a result, interference may reach the signal leads.

Such a circuit arrangement is also suitable for remote control (as only the d.c. control voltage for the circuit arrangement has to be changed), and finally it is of advantage that owing to the absence of mechanical parts which are subject to wear a lower repair frequency is to be expected.

However, the use of such a circuit arrangement also presents problems, which do not occur in the case of alternating voltage switches with mechanical contacts. When the alternating voltage is applied to a loudspeaker or an amplifier which drives a loudspeaker, an annoying click will be audible in the loudspeaker during switching over.

This clicking is caused by the fact that the state of conduction of the semiconductor elements in the circuit arrangement changes during switching over, so that the potential at the input of the circuit arrangement which is connected to the capacitor changes stepwise. The loudspeaker reproduces this potential transient as a click, which decays in accordance with the time constant of the capacitor.

In order to avoid this disturbing clicking it is known in a circuit arrangement in which the individual a.c. sources are each connected to the output amplifier via a switching diode, to apply the switching voltage for the switching diodes via an RC-network with a sufficiently great time constant. This ensures that the potential at the input of the circuit arrangement (switching diodes) does not change stepwise, but only comparatively slowly, so that the click is avoided. However, this solution has the drawback that when changing over from one a.c. source to another the signals of both a.c. sources are audible during a transition period. This is owing to the fact that the capacitor of the RC network included in the previously switched channel is not discharged at once, so that the switching diode of this channel remains conductive and the a.c. signal which is transmitted over this channel remains audible for a short time with falling level and increasing distortion.

It is an object of the invention to design a circuit arrangement of the type mentioned in the preamble in such a way that correct switching without disturbing clicks is possible.

The invention is described in more detail hereinafter with reference to an embodiment, shown in the drawing, which is particularly suitable for being realized in the integrated circuit technology.

Figure 1:
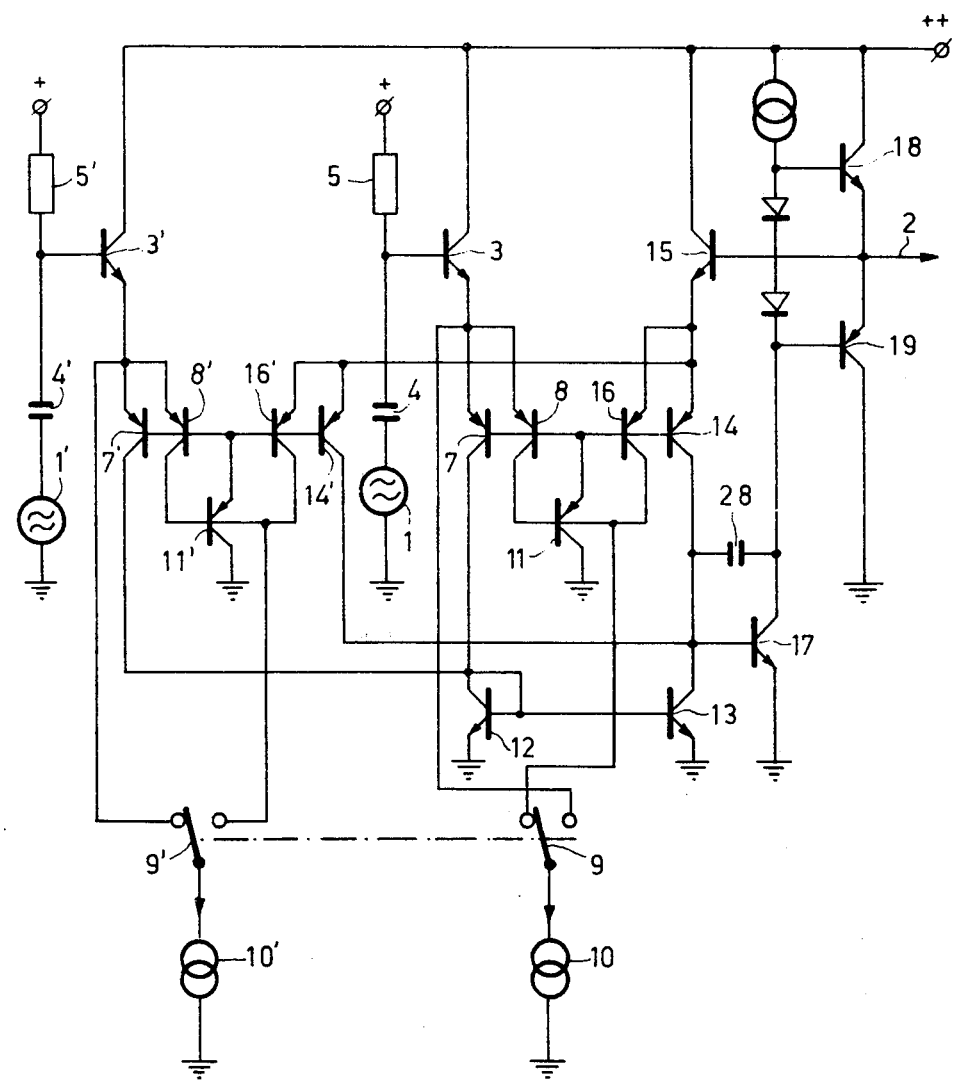
FIG. 1 shows an embodiment in which clicks are substantially eliminated.

The circuit arrangement shown in FIG. 1 comprises two damping networks, in accordance with the invention, for optionally applying one of the alternating or AC voltages supplied by the alternating or AC voltage sources 1 and 1' to the common output 2 of the circuit. Each damping network includes a transistor 3 or 3' respectively, whose base is connected to the alternating voltage source 1 or 1' via a capacitor 4 and 4' respectively and to a common bias voltage (+) via a resistor 5 and 5' respectively. The emitter of this npn transistor, whose collector is connected to the positive supply terminal (+ +), is connected to the emitters of two pnp transistors 7 and 8 or 7' and 8' respectively. The collector of the transistor 8 or 8' is connected to a contact of a switch 9 or 9' respectively, which at option connects one d.c. control source 10 or 10' to the collector of the transistor 8 (8') or to the emitter of the transistor 3(3'). The switches 9 and 9' respectively are designed so that each time only one of the control current sources 10 or 10' is connected to the collector of the transistor 8 or 8' respectively. The collector of the transistor 8(8') is moreover connected to the base of a pnp transistor 11 (11'), whose collector is earthed and whose emitter supplies the bases of the transistors 7 and 8 (7' and 8').

The collectors of the transistors 7 and 7' are jointly connected to the collector of an npn transistor 12, which functions as a diode owing to a short-circuit between collector and base, and whose emitter is connected to earth. The voltage drop between the collector or base and emitter of the transistor 12 is applied to the base of a transistor 13, whose emitter is earthed and whose collector is connected to the collectors of pnp transistors 14 and 14' respectively. The emitter supply lines of the transistors 14 and 14' are jointly connected to the emitter of a npn transistor 15, whose collector is connected to the positive supply voltage terminal. The base-emitter junction of the transistor 14 (14') is connected in parallel with the base-emitter junction of a transistor 16 (16'), whose collector is connected to the collector of the transistor 8(8') and the base of the transistor 11 (11').

The collector of the common npn transistor 13 of the two damping networks is moreover connected to the base of an npn transistor 17 which serves as a driver stage, whose emitter is earthed and whose collector is connected to its base via a capacitor 28 for reasons of stability. The collector current of the transistor 17 drives an output stage with the complementary transistors 18 and 19, whose emitters are interconnected, the connection point serving as common output for all the damping networks. To this output the base of the transistor 15 is connected.

The circuit with the transistors 3, 7, 12, 13, 14 and 15 represents an a.c. amplifier, which is known per se (Technische Information fur die Industrie, No. 156, FIG. 3a from Valvo GmbH). In the known circuit arrangement this differential amplifier serves as the input stage of an operational amplifier, and consequently the base of the transistors 7 and 14 is directly connected to a current source, so that the gain or the attenuation of this circuit remains unchanged.

If the transistors 3 and 15, 7 and 14, 12 and 13 have identical characteristics and if the same bias voltage are applied to the bases of the transistors 3 and 15, and furthermore if the base currents of said transistors, as well as the base current of the transistor 17 are negligible relative to the collector currents (high d.c. gain B), it is evident that the same current will flow in the two branches (3, 7, 12 and 15, 14, 13) in the quiescent condition. When an alternating voltage is superimposed on the direct voltage at the base of the transistor 3, the emitter current of the transistor 3 and thus the collector current of the transistor 7 will change in the rhythm of the alternating voltage; the collector current of the transistor 14 then varies in the opposite sense, whereas owing to the fact that the sum of the two base currents is constant the sum of the two collector currents must also be constant. However, because the current mirror with the transistors 12 and 13 ensures that always only the same current can flow through these transistors, once the base currents are neglected, the difference between the two currents, which is proportional to the signal at the base of the transistor 3, will flow in the base of the transistor 17.

The circuit arrangement in accordance with the invention differs from the known circuit arrangement in that via the transistor 17 and the output stage with the transistors 18 and 19 the difference signal is subject to full negative feedback. As a result the damping network will have unity gain, if the base currents of the transistors 7 and 14 are not blocked.

Moreover, in accordance with the invention, the base currents of the transistors 7 and 14 may be blocked. In the position of the switch 9 shown in the drawing the base currents will flow. The control direct current from the d.c. control source 10 then flows via the transistor 11 in the bases of the transistors 7 and 14 as well 8 and 16. However, the major part flows via the collectors of the transistors 8 and 16. If the transistors 7 and 8 and the transistors 14 and 16 have the same transistor geometry and specifically the same collector areas — which can be realized in a comparatively simple fashion in integrated circuit technology —, this will ensure that, because the base-emitter junctions are connected in parallel, the two transistors always have the same collector current and thus also the same emitter current. Consequently, the emitter current of the transistor 3 or 15 is twice as great as the emitter current of the transistor 8 or the transistor 7, and of the transistor 16 or the transistor 14 respectively. If the base currents of the transistors 7, 8, 11, 14 and 16 are negligible relative to the collector currents of the transistor 8 and 16, the collector direct currents of the transistors 8 and 16, which are equal in the quiescent condition, are half the control direct current from the d.c. control source 10. Since, as previously stated, the emitter direct current of the transistor 3 or 15 is twice the emitter direct current and thus the collector direct current of the transistor 8 or 16 respectively, the emitter direct current of the transistor 3 will equal the control direct current. The emitter direct current of the transistor 3 consequently does not change if the switch 9 is in the position which is not shown in the drawing and the control direct current flows directly via the emitter. Consequently, the base direct current of the transistor 3 and thus the direct or DC voltage at the base of the transistor 3 will not change during switching over. Thus, when the damping network is switched from the passive condition to the active condition (shown position of the switch 9) no disturbing clicks can occur — is the output signal drives a loudspeaker.

The additional transistors 8 and 16 thus ensure that the emitter of the transistor 3 receives the same current in both positions of the switch. Moreover, they reduce the signal gain, as then half the emitter alternating current of the transistor 3 flows into the transistor 8, which does not contribute to the signal gain. Owing to this, the capacitance of the capacitor 28, which is necessary for reason of stability, can be substantially halved, which is an essential advantage when the circuit arrangement is realized in integrated circuit technology, because this capacitor is to be integrated in the common semiconductor substrate. Instead of applying the control direct current via the emitter of the transistor 3 or 3' respectively in the passive position, the control direct current may also be applied to the emitter of a further transistor, which has the same characteristics as the transistor 3, and whose base is connected to the base of the transistor 3. The transistor 3 will then draw no direct base current in the passive position of the switch 9; however, the base direct current of this further transistor would then flow via the resistor 5, so that the d.c. potential at the input of the damping network would not change. However, this solution requires the use of an additional transistor.

When more than two alternating voltage sources are provided, of which each time one source is to be connected to the common output 2, further damping networks must be provided, whose circuit arrangement is identical to the left-hand damping network with the elements 1', 3' to 5', 7' to 11', 14' and 16'. The number of common circuit elements (12, 13, 15, 17, etc.) then need not be multiplied, because the switches must be interlocked in such a way that always only one damping network is active. This active damping network then produces a direct and an alternating current for the transistors 12, 13, 15, 17, etc.

As previously stated, the transistor 3 (3') only carries exactly the same current in the two positions of the switch 9(9'), if the base currents of the transistors 7, 8, 11, 14, 16 (7', 8', 14', 16') are negligible. However, in practice this requirement cannot be met, in particular when the pnp transistors 7, 8, 14 and 16 are lateral transistors. However, an exact equality of the emitter direct current of the input transistor 3 or 3' in the two position of the switch 9 and 9' respectively can be obtained if the transistor 11 has a unity current gain.

Figure 2:
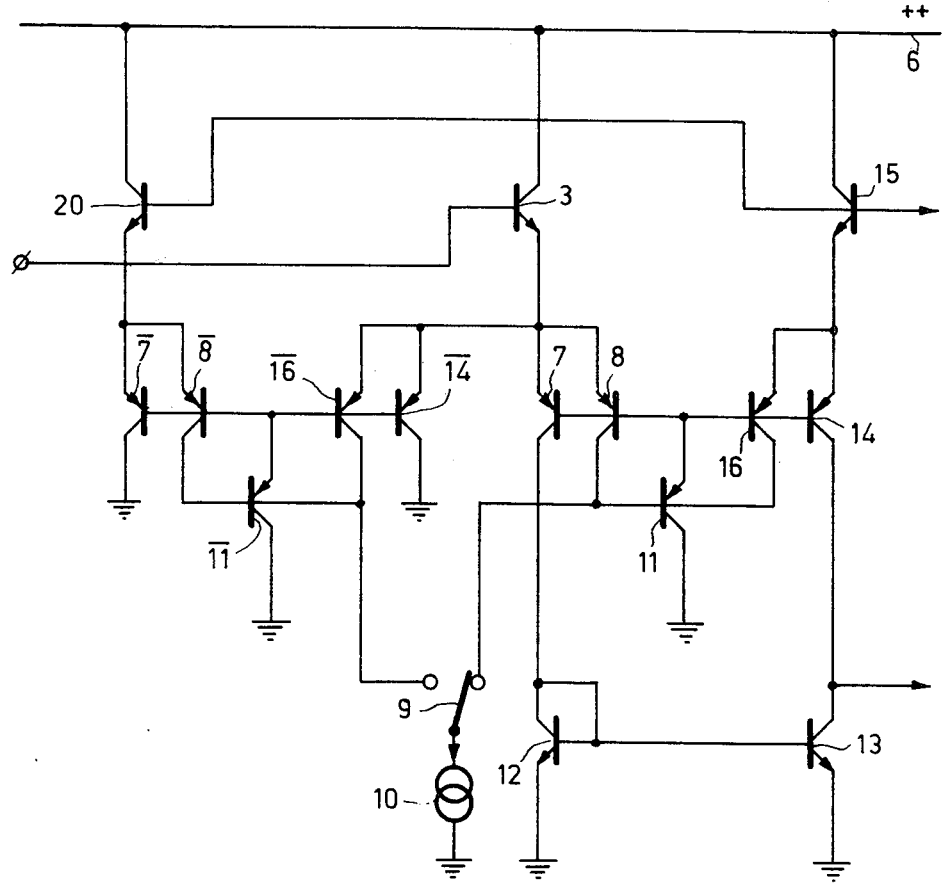
FIG. 2 shows an embodiment which provides substantially click-free switching — but at a higher cost.

FIG. 2 shows a different embodiment of a damping network with exactly the same emitter current of the input transistor in the two switch positions. This damping network comprises a switching section, which is identical to the damping network in accordance with FIG. 1 with the elements 3 and 7 to 16. Therefore, the same reference numerals are used. In addition, a switching section is provided which comprises a transistor 20, whose base is connected to the base of the transistor 15 and whose collector is connected to the positive supply voltage. Between the emitter of the transistor 20 and the emitter of the transistor 3 a transistor configuration is included, which is identical to the transistor configuration included between the emitter of the transistor 3 and the transistor 15. Therefore, the individual circuit elements have the same reference numerals, but these are overlined to distinguish them. The transistors 7 and 14, which correspond to the transistors $\overline{7}$ and $\overline{14}$, are connected to earth with their collectors.

In the position of the switch 9 shown in the drawing, the control direct current is applied via the collectors of the transistors 8 and 16 and via the base of the transistor 11. The damping network processes the d.c. signal at its input in exactly the same way as described with reference to FIG. 1. In the other position of the switch the control direct current is applied to the collectors of the transistors $\overline{8}$ and $\overline{16}$ and to the base of the transistor $\overline{11}$. The circuit including these transistors is inoperative for alternating voltages at the input, because the collectors $\overline{7}$ and $\overline{14}$ are earthed, but in respect of direct current it corresponds exactly to the circuit with the transistors 7 . . . 16. Therefore, the emitter direct current of the transistor 3 and thus its base direct current is the same in both positions of the switch 9. However, differences may of course arise owing to the fact that there are differences between the corresponding transistors, which is an effect which is negligible in the case of realization in integrated circuit technology,

What is claimed is:

1. A circuit arrangement for selectably connecting at least one AC input source to a common output point, which comprises:
    input circuit means connected to said AC input source for providing an AC output signal proportional thereto and a DC bias signal;
    a DC control current source;
    output circuit means for providing said common output point;
    damping network means connected between said input circuit means and said output circuit means for selectably connecting said AC output signal to said output circuit means while maintaining said DC bias signal substantially constant; and
    switching means having active and passive switching states for selectably connecting the DC control current source to said damping network means and said input circuit means, said switching means connecting said current source to said damping means when in the active state to cause the AC output signal and the DC bias signal to be applied to said output circuit means, and said switching means connecting said current source to said input circuit means in the passive state to cause only the DC bias signal to be applied to said output circuit means while the damping network means maintains said DC bias signal substantially constant.

2. A circuit arrangement as in claim 1, wherein said input circuit means comprises a first transistor and said damping network comprises at least a second transistor connected in series therewith at a first junction, wherein upon placing said switching means in the active state current from said DC control current source is established in said first and second transistors to obtain a DC bias output signal at said first junction, and wherein upon placing said switching means in the passive state current from said DC control current source is established in said first transistor to maintain said DC bias output signal substantially constant.

3. A circuit arrangement for selectably connecting at least one AC input source to a common output point, which comprises;
    damping network means having a first bipolar transistor of a first polarity type and a capacitor for connecting said AC input source to the base thereof, current control means including an output terminal and having a second bipolar transistor of a second polarity type opposite to that of said first transistor and having its emitter connected to the emitter of said first transistor, and a current mirror having a second terminal which is connected to the collector of said second transistor and a third terminal which is connected to said output terminal at a first junction;
    a DC control current source;
    output circuit means for providing said common output point and having an input terminal connected to said first junction;
    switching means having active and passive switching states for selectably connecting the DC control current source to said damping network means, said switching means connecting said current source to said current control means when in the active state to cause a current substantially equal to said DC control current to flow in said transistor and to cause a DC bias output signal proportional to said DC control current to appear at said common output point while providing a low value of AC attenuation between the emitter of said first transistor and said common output point, and said switching means connecting said current source to the emitter of said first transistor in the passive state to cause a current substantially equal to said DC control current to flow in said first transistor while providing a high value of AC attenuation between the emitter of said first transistor and said common output point while causing said DC bias output signal at said common output point to remain substantially constant.

4. A circuit arrangement as in claim 3, wherein said current mirror further comprises a third bipolar transistor of said first polarity type and having its base and collector both connected to said second terminal and a fourth bipolar transistor of said first polarity type and having its base connected to said second terminal and its collector connected to said third terminal, and wherein said current control means further comprises a fifth bipolar transistor of said second polarity type and having its collector connected to said output terminal and a sixth transistor of said first polarity type having its emitter connected to the emitter of said fifth transistor, the base of said fifth transistor being connected to the base of said second transistor, and negative feedback amplifier means having an amplifier input terminal connected to said first junction and an amplifier output terminal connected to the base of said sixth transistor.

5. A circuit arrangement as in claim 4, wherein said current control means further comprises a seventh bipolar transistor of the second polarity type and having its base and emitter connected in parallel respectively with the base and emitter of said second transistor, an eighth bipolar transistor of said second polarity type and having its base and emitter connected in parallel respectively with the base and emitter of said fifth transistor, and a ninth bipolar transistor of said second conductivity type and having its base connected to the collectors of said seventh and eighth transistors and its emitter connected to the bases of said seventh and eigthth transistors, said switching means connecting said current source to the base of said ninth transistor in said current control means when said switching means is in the active state.

6. A circuit arrangement as in claim 5, wherein said ninth transistor has a current gain of at least approximately one.

* * * * *

UNITED STATES PATENT AND TRADEMARK OFFICE
CERTIFICATE OF CORRECTION

PATENT NO. : 4037118
DATED : July 19, 1977
INVENTOR(S) : GUNTER SIEBORGER ET AL

It is certified that error appears in the above-identified patent and that said Letters Patent are hereby corrected as shown below:

Column 4, line 3, change "is" to -- if --.

Signed and Sealed this

Thirteenth Day of December 1977

[SEAL]

Attest:

RUTH C. MASON
*Attesting Officer*

LUTRELLE F. PARKER
*Acting Commissioner of Patents and Trademarks*